United States Patent [19]

Kaplinsky

[11] Patent Number: 4,967,107

[45] Date of Patent: Oct. 30, 1990

[54] PROGRAMMABLE LOGIC EXPANDER

[75] Inventor: Cecil H. Kaplinsky, Palo Alto, Calif.

[73] Assignee: Plus Logic, Inc., San Jose, Calif.

[21] Appl. No.: 351,840

[22] Filed: May 12, 1989

[51] Int. Cl.[5] ............................................. H03K 19/00
[52] U.S. Cl. .................................. 307/465; 307/202.1; 307/468
[58] Field of Search ...................... 307/202.1, 465–469; 364/716; 340/825.83, 825.84

[56] References Cited

U.S. PATENT DOCUMENTS

| | | | |
|---|---|---|---|
| 4,029,970 | 6/1977 | Hong et al. | 307/207 |
| 4,124,899 | 11/1978 | Birkner et al. | 364/716 |
| 4,207,556 | 8/1980 | Sugiyama | 340/166 R |
| 4,292,548 | 9/1981 | Suarez et al. | 307/465 |
| 4,314,349 | 2/1982 | Batcher | 364/716 |
| 4,431,928 | 2/1984 | Skokan | 307/465 |
| 4,525,641 | 6/1985 | Cruz et al. | 307/465 |
| 4,609,986 | 9/1986 | Hartmann et al. | 364/200 |
| 4,642,487 | 4/1987 | Carter | 307/465 |
| 4,670,749 | 6/1987 | Freeman | 340/825 |
| 4,689,654 | 8/1987 | Brockmann | 357/45 |
| 4,703,206 | 10/1987 | Cavlan | 307/465 |
| 4,742,252 | 5/1988 | Agrawal | 307/465 |
| 4,761,570 | 8/1988 | Williams | 307/465 |
| 4,763,020 | 8/1988 | Takata et al. | 307/465 |
| 4,771,285 | 9/1988 | Agrawal et al. | 307/465 X |
| 4,774,421 | 9/1988 | Hartmann et al. | 307/465 |

OTHER PUBLICATIONS

Ikawa et al., IEEE Journal of Solid-State Circuits, vol. sc-21 (Apr. 1986), pp. 223–227.
Robinson, BYTE Magainze, Jan., 1987, pp. 197–203.
Coli, BYTE Magazine, Jan., 1987, pp. 207–219.
Electronics Magazine, Sep. 17, 1987, pp. 65–72.

Primary Examiner—David Hudspeth
Attorney, Agent, or Firm—Thomas Schneck

[57] ABSTRACT

A programmable logic device that provides an AND gate array connected to an OR gate array connected to a third logic level, a logic expander module. The module provides programmable selection of any of 16 one- and two-variable logic functiosn or any of 256 one-, two- and three-variable logic functions. In one embodiment, the invention uses logic function gates such as AND, OR, XOR and inverter gates to form the logic functions. In a second embodiment and a third embodiment, a look-up table and an array of pass transistors, respectively, are used to form the logic functions.

23 Claims, 6 Drawing Sheets

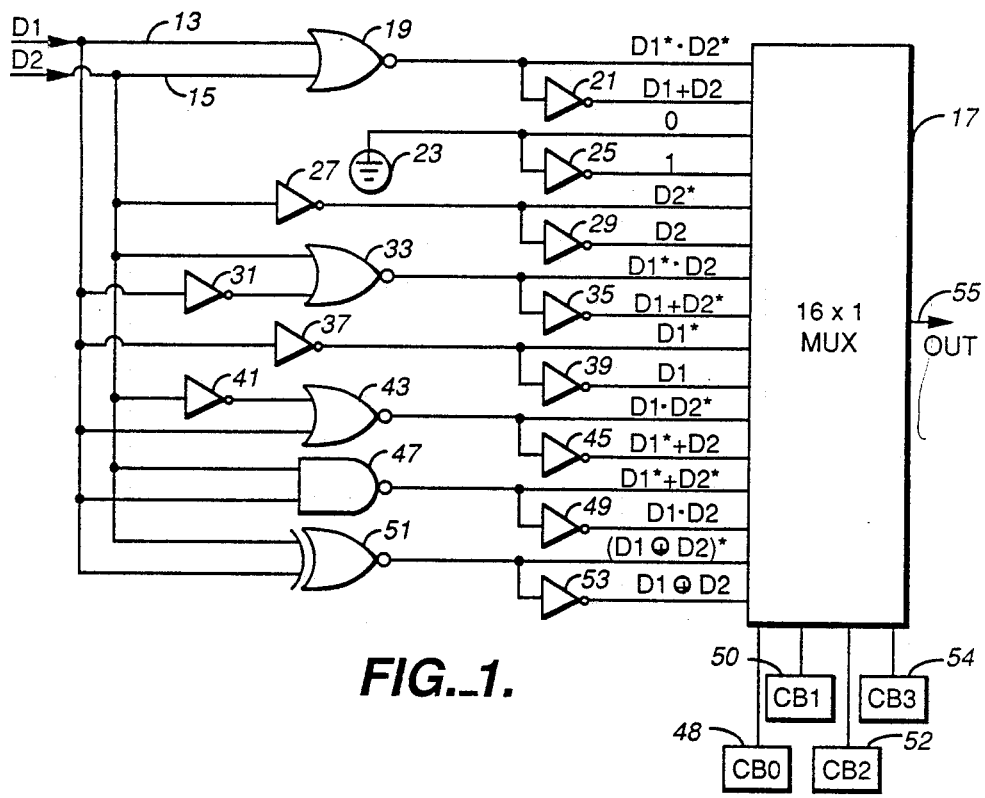
FIG._1.
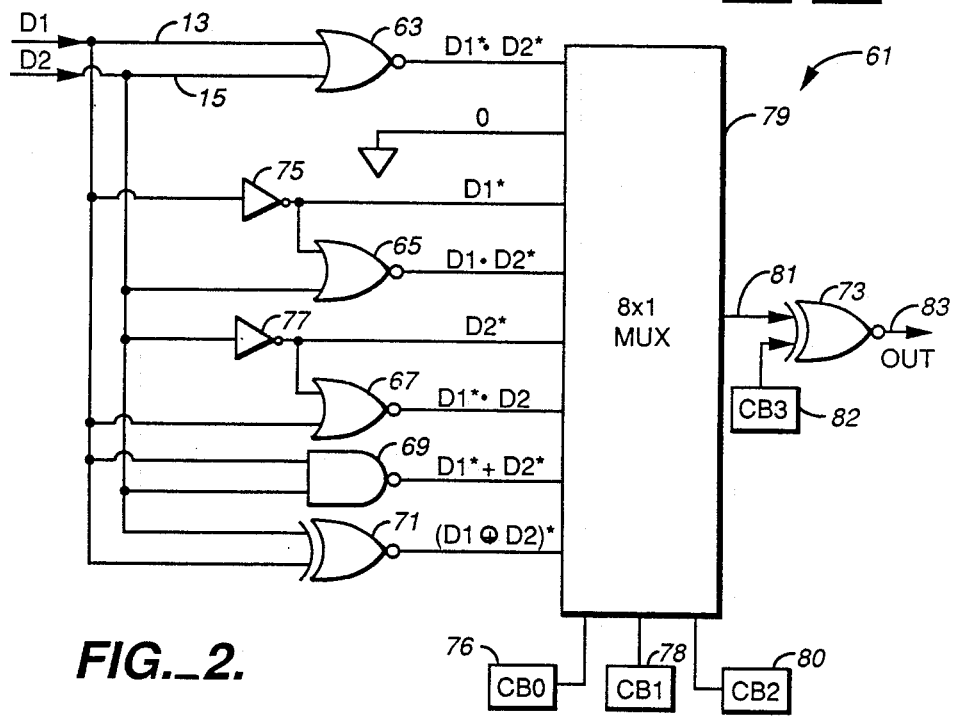
FIG._2.

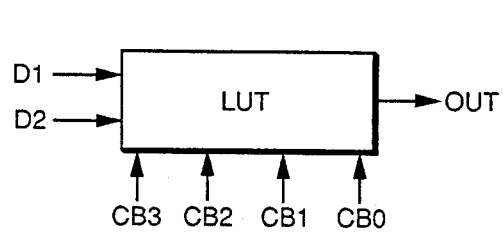
FIG._3.
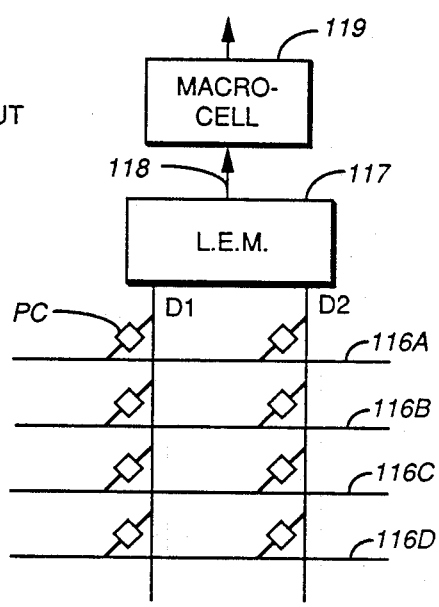
FIG._6.
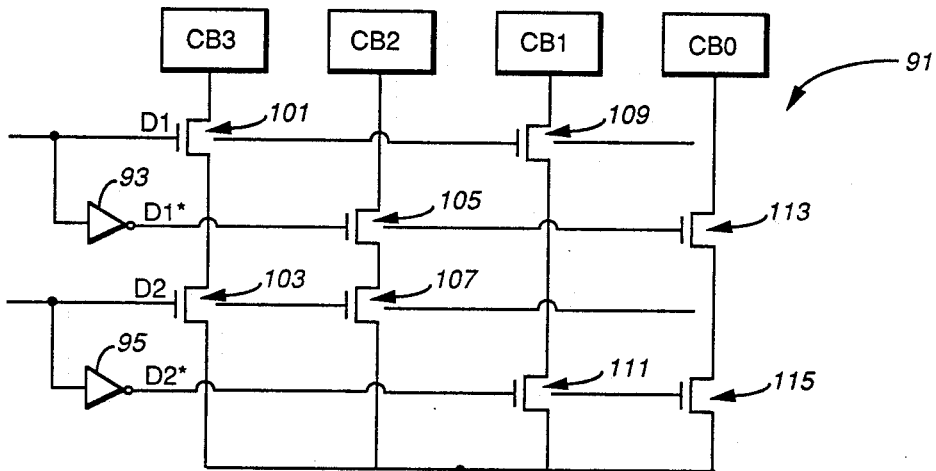
FIG._4.

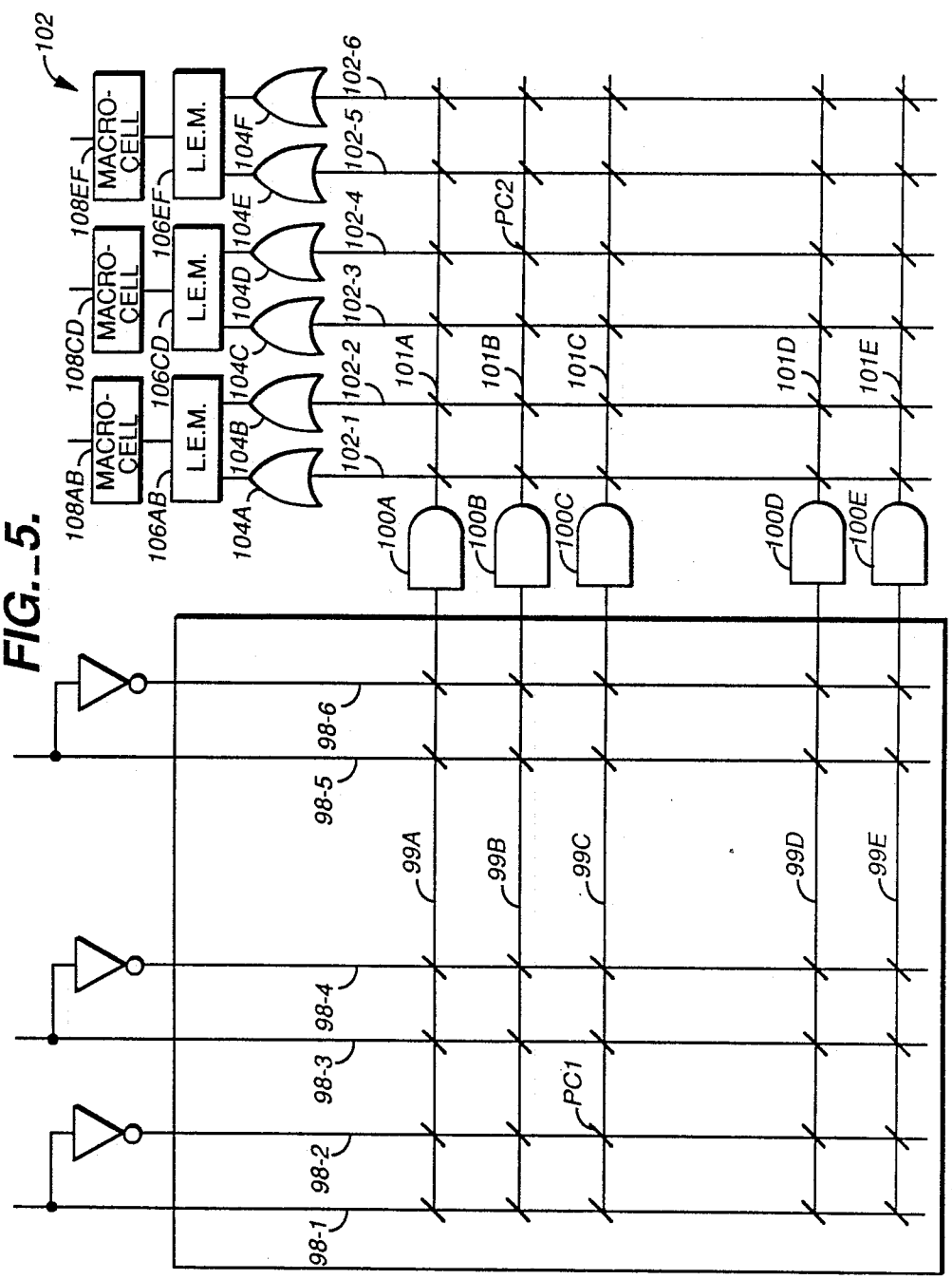
FIG._5.

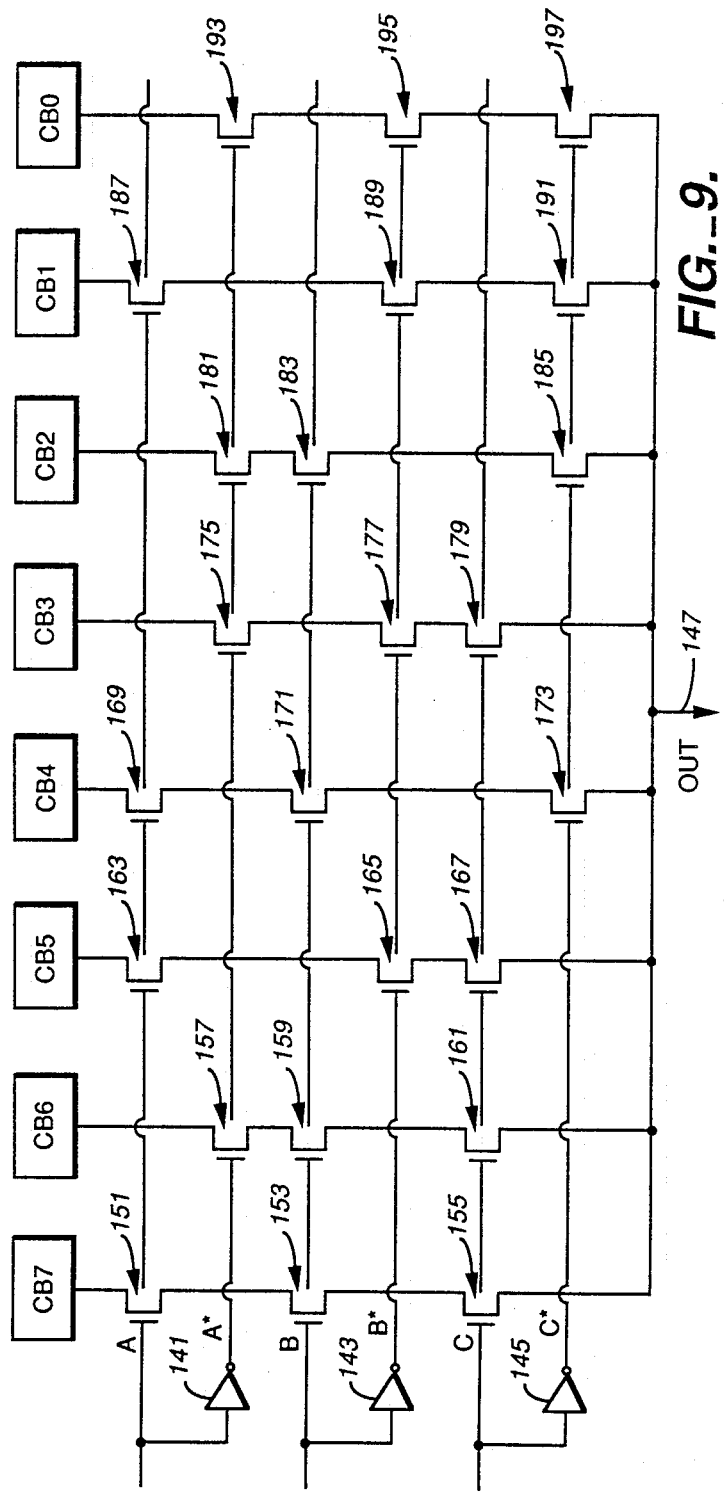
FIG._9.
FIG._10.

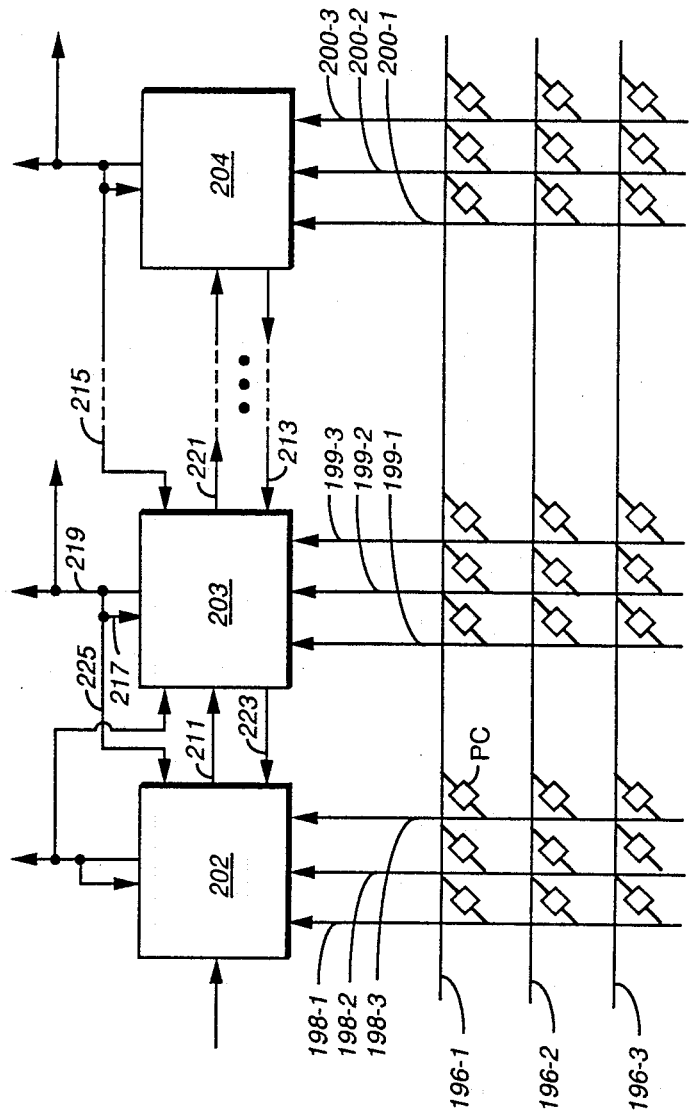
FIG._11.

PROGRAMMABLE LOGIC EXPANDER

TECHNICAL FIELD

The present invention relates generally to programmable logic devices and in particular to logic architectures for improving the functional flexibility of programmable logic devices.

BACKGROUND ART

Programmable logic devices ("PLDs") are integrated circuits that may be used to provide logical commands and logical functions in electronic systems. A PLD will typically include a set of input pins, an AND array of logic gates followed by an OR array of logic gates and a set of output pins. A PLD may also provide programmable options, often called macrocells, for one or more feedback lines following the OR array to provide registered output signals and sequential logic capabilities in addition to the combinatorial logic functions provided by the AND/OR arrays alone. Presently, several basic types of PLD architectures are available. In a programmable logic element ("PLE", also referred to as a PROM), the AND array is fixed and the OR array is programmable; PLEs are useful in applications requiring use of most or all of the possible input combinations, such as look-up tables and character generators. However, because the array size must be doubled for each new input that is added to the system, PLEs are limited by cost and performance constraints to a small number of input terminals.

A programmable array logic device ("PAL") has a programmable AND array but a fixed OR array. The PAL device allows formation of arbitrary product or input terms but has fixed output combinations that flow to and through the OR array. A variation of the PAL device is the HAL device, which provides hard array logic that is mask programmed, generally after the design is thoroughly debugged using a corresponding PAL device.

A programmable logic array ("PLA") allows both the AND array and the OR array to be programmed. The PLA device offers the most flexibility among these three classes of devices, but a PLE device or a PAL device is faster than the corresponding PLA device because a dedicated or non-programmable AND gate or OR gate is faster than a programmable AND gate or OR gate, respectively. Applications that do not require a high degree of functional flexibility often use PAL devices to take advantage of the speed available vis-a-vis the corresponding PLA device.

One of the early PAL devices that has attained widespread use is the programmable array logic circuit disclosed by Birkner et al. in U.S. Pat. No. 4,124,899, which disclosed use of twenty input pins and provision of registered output signals with feedback from the OR array output terminals to the AND gate array input terminals. An OR gate output terminal could be disabled so that the corresponding output pin could serve as an input pin with corresponding feedback path to the AND gate array. In a subsequently introduced series of megaPALs, Monolithic Memories increased the size of the AND gate array and allowed a fixed number of AND product terms to be shared between two output terminals.

The Altera EP1200 chip is segmented into a sequence of sub-PALs having only four output terminals, with the output terminals of particular sub-PAL being available as input terminals for some of the other subPALs. All of the input signals are available to all of the AND gates simultaneously, resulting in AND arrays with 64 input terminals, most of which are unused for a given product term.

In U.S. Pat. No. 4,207,556, Sugiyama et al. disclose a programmable logic array having a plurality of logic cell units, each cell comprising a plurality of resistors, diodes and transistors, a wiring matrix of row and column lines, and a switch array unit having a group of switching elements for selectively interconnecting the various row and column lines and the electronic elements. This arrangement sacrifices some density and speed to attain greater functional flexibility by including a large number of electronic elements with variable wiring in each unit.

Ikawa et al. in "A One Day Chip: An Innovative IC Construction Approach . . . " IEEE Journal of Solid State Physics, vol. SC-21, April 1986, pp. 223–227, discloses a VLSI chip that contains 50–200 standard functional blocks of SSI/MSI integration that perform various functions such as inverters, NOR and NAND gates, flip-flops, shift registers, counters, multipliers, etc. Each of these functional units may be connected to other functional units by means of an EEPROM switch matrix. The switch matrix provides flexibility and can easily be reprogrammed, but use of a large number of standard functional blocks may be necessary to provide true flexibility; and most of these blocks would be unused for a given chip function.

Takata et al., in U.S. Pat. No. 4,763,020, disclose a programmable logic device that includes a plurality of connection lines, each connected to an input terminal at one end and to one of a plurality of input buffer circuits at the other end. Each input buffer circuit has an inverting input line and a non-inverting input line extending vertically and has product term lines extending horizontally to a respective sense amplifier. Taken together, the input lines, product term lines and sense amplifiers form a programmable AND plane. Each cross-over point between a product term and an input line is connected by a programmable element. The sense amplifiers are arranged in groups, and the output terminals of the sense amps in each group are connected to input terminals of an associated OR gate. The OR plane is non-programmable as disclosed; Takata et al. indicates that the OR plane may also be programmable, but the technique is not disclosed. An OR gate has its output terminal connected to a D input terminal of a flip-flop, which has an output terminal connected to the device output terminal. Another output terminal of the flip-flop is connected to a feedback circuit that is connected to a pair of input lines in the AND plane through an input buffer circuit. A second OR gate has its output terminal connected to an input terminal of a function cell, and Takata et al. indicate that more than two functional cells may be provided. The output terminals of the functional cells are connected to feedback circuits that are connected to input line pairs in the AND plane through input buffer circuits. The device disclosed by Takata et al. can be structured, for example, as an up-counter a down-counter or a shift register, among other uses.

The devices discussed above provide some functional flexibility when dealing with the normal product terms and sums thereof that are produced by an AND gate/OR gate array but do not provide other functional terms that are used in processing signals such as the product of two n-bit numbers or majority logic.

An object of the invention is to provide a programmable logic device that allows formation of other useful logical variables and functions that are not available in the present technology.

SUMMARY OF THE INVENTION

This object is met by an invention that provides a third level of logic, called a logic expander module herein, that supplements or builds on two lower levels of logic, represented by an AND gate plane and an OR gate plane. The logic expander module provides all useful logical combinations of two or more logical variables, including generalized products such as A.B+B.-C+A.C and A+B+C that are useful in implementing majority logic and in formation of the carry and sum functions in multiplication of two n-bit numbers. The logic expander module accepts two or three logical variables A, B, C as inputs and accepts a sequence of two or more configuration bits and produces any one of up to sixteen combinations of two logical variables or up to 256 combinations of three logical variables, using a multiplexer, a look-up table or other suitable selection means for selection of the function.

BRIEF DESCRIPTION OF THE DRAWINGS

FIGS. 1 and 2 are two embodiments of the logic expander invention that accepts two logical variables as input signals and uses logic gates and a multiplexer for output signal formation and selection.

FIG. 3 is a schematic view of an embodiment of the invention that accepts two logical variables as input signals and uses a look-up table for output signal selection.

FIG. 4 is a schematic view of an embodiment of the invention that accepts two logical variables as input signals and uses pass transistors and a signal summation means for output signal formation and selection.

FIG. 5 illustrates a context in which a plurality of logic expander modules might be used in a programmable logic device.

FIGS. 6, 7 and 8 are schematic views of one or two logic expander modules used with an AND gate array and an OR gate array, also illustrating the optional use of a hard-wired supplemental logic expander module.

FIG. 9 is a schematic view of an embodiment of the invention that accepts three logical variables as input signals and uses pass transistors and a signal summation means for output signal formation and selection.

FIG. 10 is a schematic view of an embodiment of the invention that accepts three logical variables as input signals and uses a look-up table for output signal selection.

FIG. 11 is a schematic view showing one mode of operation of a plurality of programmable logic expanders in parallel with connections between these expanders.

BEST MODE FOR CARRYING OUT THE INVENTION

Figures 7, 8:
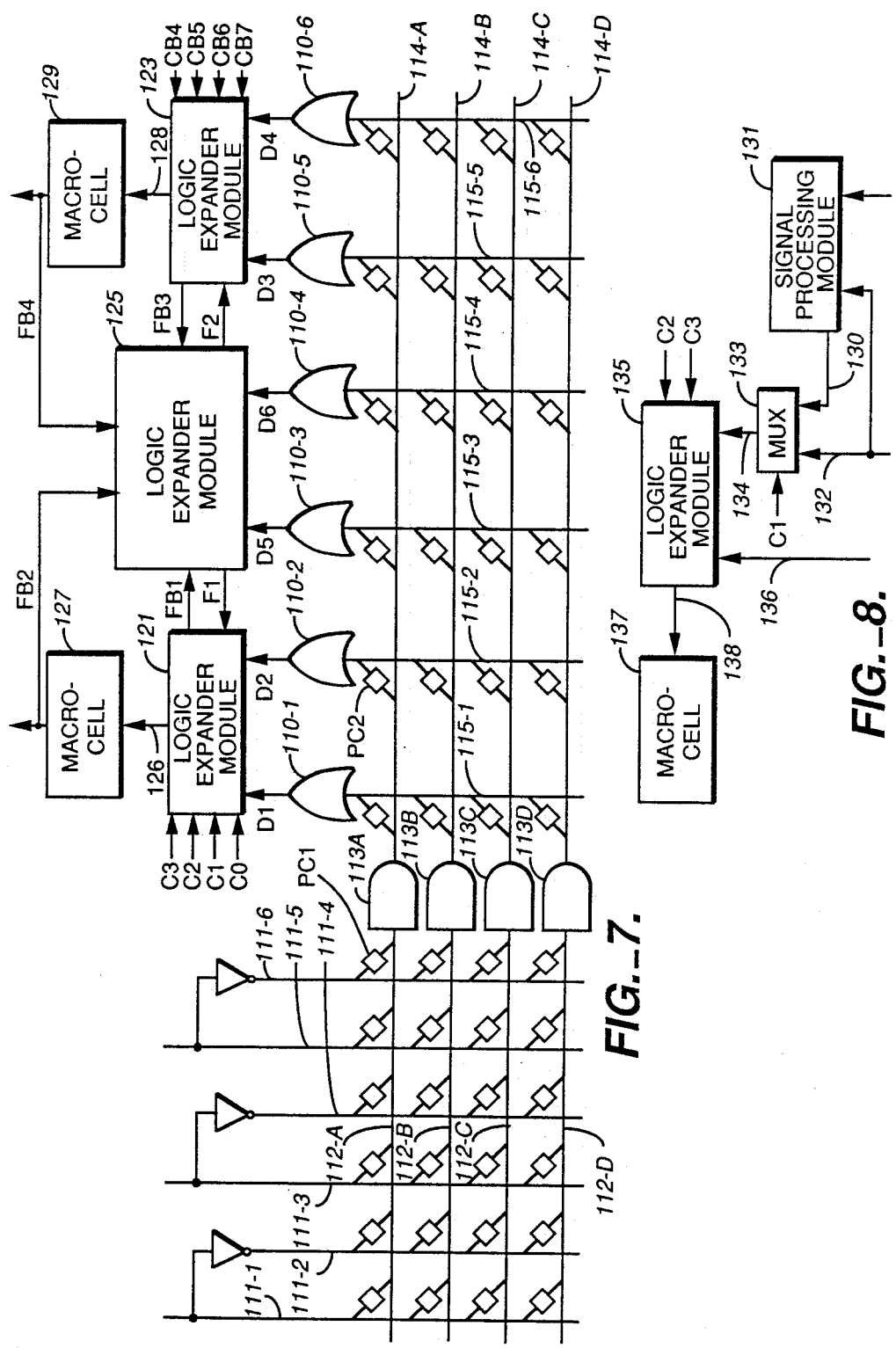

With reference to FIG. 1, which illustrates one embodiment of a two-variable logic expander module 11, two input lines 13 and 15 receive two input signals D1 and D2, respectively, and form various logical functions of these two variables and pass these functions to sixteen input terminals of a 16×1 multiplexer ("MUX") 17. A first NOR gate 19 receives the module input signals D1 and D2 and forms the output signal D1 NOR D2=D1*.D2* and passes this output signal to a first input terminal of the MUX 17, where D1* is the logical complement of D1. The output signal of the first NOR gate 19 is also passed through a first inverter 21, and the output thereof is passed to a second input terminal of the MUX 17. The first and second input terminals of the MUX 17 receive the signals (D1+D2)*=D1*.D2* and D1 =D2 , respectively.

One end 23 of a conducting line is tied to ground voltage and a second end thereof is passed to a third input terminal of the MUX 17. The second end of the line is also connected to a second inverter 25, and the output thereof is passed to a fourth input terminal of the MUX 17. The third and fourth input terminals of the MUX 17 receive the signals 0 and 1, respectively.

The signal D2 is passed through a third inverter 27 and then to a fifth input terminal of the MUX 17. This inverter output signal is also passed through a fourth inverter 29 to a sixth input terminal of the MUX 17. The fifth and sixth input terminals of the MUX 17 receive the signals D2* and D2, respectively.

The signal D1 is inverted by a fifth inverter 31 and the signals D1* and D2 are passed to a second NOR gate 33 whose output signal is passed to a seventh input terminal of the MUX 17. The output signal of the NOR gate 33 is also passed through a sixth inverter 35 to an eighth input terminal of the MUX 17. The seventh and eighth input terminals of the MUX 17 receive the signals D1*.D2 and D1+D2*, respectively.

The signal D1 is passed through a seventh inverter 37, and then to a ninth input terminal of the MUX 17. The inverter output signal is also passed through an eighth inverter 39 to a tenth input terminal of the MUX 17. The ninth and tenth input terminals of the MUX 17 receive the signals D1* and D1, respectively.

The signal D2 is passed through a ninth inverter 41, the signals D2* and D1 are passed to a third NOR gate 43, and the output signal thereof is passed to an eleventh input terminal of the MUX 17. The output signal of the NOR gate 43 is also passed through a tenth inverter 45 to a twelfth input terminal of the MUX 17. The eleventh and twelfth input terminals of the MUX 17 receive the signals D1.D2* and D1*+D2, respectively.

The signals D1 and D2 are passed to a NAND gate 47 and the output signal thereof is passed to a thirteenth input terminal of the MUX 17. The output signal of the NAND gate 47 is also passed through an eleventh inverter 49 to a fourteenth input terminal of the MUX 17. The thirteenth and fourteenth input terminals of the MUX 17 receive the signals D1*+D2* and D1.D2, respectively.

The signals D1 and D2 are passed to an XOR gate 51 and the output signal thereof is passed to a fifteenth input terminal of the MUX 17. The output signal of the XOR gate 51 is also passed through a twelfth inverter 53 to a sixteenth input terminal of the MUX 17. The fifteenth and sixteenth input terminals of the MUX 17 receive the signals (D1⊕D2)* and (D1⊕D2).

The output signal of the MUX 17 appears on output line 55 and is determined by four configuration bits or control signals CB0, CB1, CB2 and CB3 that are provided by control signal sources 48, 50, 52 and 54, respectively, and that are received at four input control terminals of the MUX 17. Upon receipt of the four configuration bits CB0–CB3, the MUX 17 selects one of the sixteen input signals received at the input terminals of the MUX for the output signal, according to Table 1 below or some permutation of the entries in Table 1.

TABLE 1

| Output Selection for Two-variable 16 × 1 Multiplexer | | | | |
|---|---|---|---|---|
| CB3 | CB2 | CB1 | CB0 | MUX Output |
| 0 | 0 | 0 | 0 | (D1 + D2)* = D1* · D2* |
| 0 | 0 | 0 | 1 | D1 + D2 |
| 0 | 0 | 1 | 0 | 0 |
| 0 | 0 | 1 | 1 | 1 |
| 0 | 1 | 0 | 0 | D2* |
| 0 | 1 | 0 | 1 | D2 |
| 0 | 1 | 1 | 0 | D1* · D2 |
| 0 | 1 | 1 | 1 | D1 + D2* |
| 1 | 0 | 0 | 0 | D1* |
| 1 | 0 | 0 | 1 | D1 |
| 1 | 0 | 1 | 0 | D1 · D2* |
| 1 | 0 | 1 | 1 | D1* + D2 |
| 1 | 1 | 0 | 0 | D1* + D2* |
| 1 | 1 | 0 | 1 | D1 · D2 |
| 1 | 1 | 1 | 0 | (D1 ⊕ D2)* |
| 1 | 1 | 1 | 1 | D1 ⊕ D2 |

The embodiment of the logic expander module 11 shown in FIG. 1 produces all sixteen of the logical combinations of two variables, as may be verified by inspection. This first embodiment requires three NOR gates, a NAND gate, an XOR gate, twelve inverters and a 16×1 multiplexer. A second embodiment of the logic expander module 61, shown in FIG. 2, requires an 8×1 multiplexer 79, three NOR gates 63, 65 and 67, a NAND gate 69, two XOR gates 71 and 73 and only two inverters 75 and 77, positioned as shown. Eight input lines now feed an 8×1 MUX 79, whose output on the line 81 is determined by receipt by the MUX of three configuration bits CB0, CB1 and CB2 provided by three control signal sources 76, 78 and 80 at three control input terminals of this MUX. The output signal of the MUX 79 is passed on line 81 to a first input terminal of the XOR gate 73, which receives a fourth configuration bit CB3 from a control signal source 82 at a second input terminal. The XOR gate 73 serves as a programmable inverter, with polarity control input signal CB3 serving to invert or not invert the output signal 081 of the line 81, according as CB3=1 or CB3=0. The output signal of the logic expander module 61 appears on the output line 83. It is easily verified that the same sixteen two-variable output signals are produced by the embodiment 61 as are produced by the embodiment 11 shown in FIG. 1. The output signal of the 8×1 MUX 79, which appears on the line 81, may be selected from among the eight input signals to the MUX as shown in Table 2 or any permutation of the entries in Table 2. Many other embodiments of the two-variable logic expander modules may be set down using standard logic gates, but the two embodiments shown in FIGS. 1 and 2 are representative of the approaches that may be used. A subset of the 16 output signals produced by the apparatus shown in FIG. 1 or FIG. 2 may also be generated. For example, two or three configuration bits may be used to select any one of four or eight functions, respectively, from among these 16 functions.

TABLE 2

| Output Selection for Two-variable 8 × 1 Multiplexer | | | |
|---|---|---|---|
| CB2 | CB1 | CB0 | MUX Output |
| 0 | 0 | 0 | D1* · D2* |
| 0 | 0 | 1 | 0 |
| 0 | 1 | 0 | D1* |

TABLE 2-continued

| Output Selection for Two-variable 8 × 1 Multiplexer | | | |
|---|---|---|---|
| CB2 | CB1 | CB0 | MUX Output |
| 0 | 1 | 1 | D1 · D2* |
| 1 | 0 | 0 | D2* |
| 1 | 0 | 1 | D1* · D2 |
| 1 | 1 | 0 | D1* + D2* |
| 1 | 1 | 1 | (D1 ⊕ D2)* |

The logic expander module can also be implemented as a look-up table LUT, as shown in FIG. 3, having two data input terminals, four control input terminals for the four configuration bits CB0, CB1, CB2 and CB3 and having an output terminal that issues as an output signal one of the sixteen, logical functions of the two variables D1 and D2, shown in Table 1. The transistor embodiment of the logic expander module 61 shown in FIG. 2 would require about 66 transistors plus memory cells and thus consume considerable chip real estate. The look-up table embodiment shown in FIG. 3 would require only a configuration bit decoder and four sets of 16 memory cells, one set for each of the four possible combinations of the logical variables D1 and D2.

FIG. 4 illustrates an embodiment of the two-variable logic expander module that can be fabricated with eight pass transistors and two inverters, using the four configuration bits as input signals for four of these transistors. A pass transistor has an input terminal, a pass terminal that serves as a gate, and an output terminal. An input signal that appears at the input terminal will be passed to the output terminal or will be blocked according as the pass terminal or gate is open or is closed. A pass transistor may be n-channel type, where imposition of a relatively high voltage signal, corresponding to a logical "one" signal, at the pass terminal opens the gate and imposition of a relatively low voltage signal, corresponding to a logical "zero" signal, at the pass terminal closes the gate. In a pass transistor of p-channel type, the gate is opened and closed by imposition of a relatively low voltage signal and a relatively high voltage signal, respectively, at the pass terminal. For purposes of illustration in FIG. 4, all pass transistors are assumed to be n-channel type. However, all these pass transistors could be p-channel type, in which event the signals D1, D1*, D2 and D2* delivered to the pass terminals should be inverted; or a mixture of n-channel and p-channel pass transistors could be used in the embodiment illustrated in FIG. 4.

Two data input terminals of the module 91 in FIG. 4 receive data input signals D1 and D2, and those signals are also passed through two inverters 93 and 95 in parallel paths so that the four signals D1, D1*, D2 and D2* are produced as shown. Four configuration bits CB0, CB1, CB2 and CB3 are programmed and provided for the module as control signals at four control input terminals. The control signal CB3 serves as an input signal for a first pass transistor 101 that receives the signal D1 at its pass terminal, thus producing an intermediate output signal that is representable logically as CB3.D1, or as a floating (undefined) signal if D1=0, for the pass transistor 101. This intermediate output signal is fed to the input terminal of a second pass transistor 103, which receives the signal D2 at its pass terminal and produces the output signal component that is representable logically as CB3.D1.D2, or as D2 multiplied by a floating signal, at the output terminal of the second pass transistor 103. The output signal component from the pass transistor 103 is passed to an output line 97, if D1 and D2 are high; if either D1 or D2 or both are low, the output signal from pass transistor 103 is floating, and the output signal O97 is driven by another of the four output signal components.

In a similar manner, the configuration bits CB2, CB1 and CB0 are each fed to the input terminal of the first of a pair of pass transistors (105, 107), (109, 111) and (113, 115), respectively, and the intermediate output signal of that first pass transistor is fed to the input terminal of the second of the pair of pass transistors, as illustrated in FIG. 4. The pass transistor pairs (105, 107), (109, 111), and (113, 115) receive the pairs of signals (D1*, D2), (D1, D2*) and (D1*, D2*), respectively, at their pass terminals; and the output signal components that appear at the output terminals of pass transistors 107, 111 and 115 are CB2.D1*.D2 or a floating signal, CB1.D1.D2* or a floating signal, and CB0.D1*.D2* or a floating signal, respectively. Each of the four output signal components is fed to the output line 97, and the total output signal that issues from the output terminal 97 is then representable logically as a signal $$O97 = CB3.D1.D2 + CB2.D1^*.D2 + CB1.D1.D2^* + CB0.D1^*.D2^*.$$

By appropriate choice of each of the configuration bits CB3, CB2, CB1 and CB0, each =0 or =1, the output signal O97 will generate, or be representable as, each of the 16 two-variable combinations shown in Table 1, using the Boolean relations $D1+D1^*=1=D2+D2^*$. For example, the choice CB3=CB2=CB1=CB0=1 produces the signal O97=1; and the choice CB3=CB1=CB0=1 and CB2=0 produces the signal $O97=D1+D2^*$. Table 3 sets forth the configuration bit choices for each of the 16 two-variable combinations. All possible permutations of the entire O97 list in Table 3 may be obtained by permuting the locations of the two pass transistors within each vertical line in FIG. 4.

TABLE 3

Two-variable Output Selection for Pass Transistor Embodiment

| CB3 | CB2 | CB1 | CB0 | O97 |
|---|---|---|---|---|
| 0 | 0 | 0 | 0 | 0 |
| 0 | 0 | 0 | 1 | D1* · D2* |
| 0 | 0 | 1 | 0 | D1 · D2* |
| 0 | 0 | 1 | 1 | D2* |
| 0 | 1 | 0 | 0 | D1* · D2 |
| 0 | 1 | 0 | 1 | D1* |
| 0 | 1 | 1 | 0 | D1 ⊕ D2 |
| 0 | 1 | 1 | 1 | D1* + D2* |
| 1 | 0 | 0 | 0 | D1 · D2 |
| 1 | 0 | 0 | 1 | D1* ⊕ D2 |
| 1 | 0 | 1 | 0 | D1 |
| 1 | 0 | 1 | 1 | D1 + D2* |
| 1 | 1 | 0 | 0 | D2 |
| 1 | 1 | 0 | 1 | D1* + D2 |
| 1 | 1 | 1 | 0 | D1 + D2 |
| 1 | 1 | 1 | 1 | 1 |

If only a subset of the 16 signals set forth in Table 1 is to be generated, the number n of configuration bits required may be fewer than four (1<n<4). For example, if the logic expander module is only required to generate and issue any of four signals from among the 16 signals set forth in Table 1, n=2 configuration bits may be used for the look-up table shown in FIG. 3, for a simplification of the pass transistor configuration shown in FIG. 4 (or a variant thereof), or for a simplification of the configurations shown in FIGS. 1 or 2.

FIG. 5 illustrates the context in which a plurality of logic expanders might be used. A first array of lines 98-1, 98-2, 98-3, 98-4, 98-5 and 98-6 delivers a plurality of input signals and their logical complements. The lines 98-1, . . . 98-6 are selectively connected to a second array of lines 99A, 99B, 99C, 99D and 99E by programmable connectors such as PC1 forming a wire AND array as used in PLDs and represented in FIG. 5 by the AND gates 100A, 100B, 100C, 100D and 100E. The outputs of these AND gates are issued on the respective output lines 101A, 101B, 101C, 101D and 101E. These output lines are selectively OR'ed to groups of lines 102-1, 102-2, 102-3, 102-4, 102-5 and 102-6 by programmable connections such as PC2 between the lines. This OR function is shown in FIG. 5 by OR gates 104A, 104B, 104C, 104D, 104E and 104F respectively.

The output signals from a first pair of OR gates 104A and 104B are fed as input signals to a first logic expander module 106AB. These two input signals play the roles of the signals D1 and D2 that appear in FIGS. 1, 2, 3 and 4. More generally, the output signals from any integer number N≧2 of OR gates in the OR gate array may be fed to the logic expander module 106AB. In a similar manner, the output signals from a second pair of OR gates 104C and 104D are fed to a second logic expander module 106CD, and the output signals from a third pair of OR gates 104E and 104F are fed to a third logic expander module 106EF. A plurality of macrocells 108AB, 108CD and 108EF receive the output signals from the logic expander modules 106AB, 106CD and 106EF, respectively, for further processing.

In FIG. 5, an array of AND gates feeds an array of OR gates within a programmable logic device and produces combinations of terms such as A.B+C.D where A, B, C and D are general logical variables. In an alternative arrangement, an array of OR gates may feed an array of AND gates and yield equivalent terms, if the input signals delivered to the OR gate array input terminals are inverted and the output signals from the AND gate array are also inverted. This equivalence is confirmed by observing that $[(A^*+B^*).(C^*+D^*)]^* = A.B+C.D$, using the de Morgan laws, so that the above-cited output signal A.B+C.D can be generated by either arrangement of an AND gate array and an OR gate array. Thus, an OR gate array may feed an AND gate array.

FIGS. 6, 7 and 8 illustrate uses of the logic expander module in representative logic signal processing environments. An AND gate array, programmable or non-programmable, produces a group of product term signals that are fed to an OR gate array, which may also be programmable or non-programmable. Selected sum terms that result from the OR gate array output signals are fed to one or more logic expander modules to form further logic functions of these sum terms, considered as input variables. In FIG. 6, a logic expander module 117 receives two or more data input signals D1 and D2 at its data input terminals, processes these input signals, and issues an output signal on a line 118 that is received by a macro cell 119 for further processing and/or feedback and/or issue at an output pin of the system. The input signals D1 and D2 are received through programmable connections PC established between an array of signal lines 116A, 116B, 116C and 116D and the input lines that carry the signals D1 and D2 to the logic expander module 117.

FIG. 7 illustrates the operation of two logic expander modules and a supplemental logic expander module. A first array of lines 111-1, 111-2, 111-3, 1114, 111-5 and 111-6 delivers a plurality of input signals and their logical complements. These lines are selectively connected to a second array of lines 112A, 112B, 112C and 112D by programmable connectors such as PC1, forming a wire AND array and represented by the AND gates 113A, 113B, 113C and 113D, respectively. The outputs of these AND gates are issued on the respective output lines 114A, 114B, 114C and 114D. These latter output lines are selectively OR'ed by programmable connections such as PC2 to groups of lines 115-1, 115-2, 115-3, 115-4, 115-5 and 115-6. The first two groups 115-1 and 115-2 of these lines are fed to OR gates 110-1 and 110-2, respectively, and the output signals D1 and D2 from these OR gates are fed to a first logic expander module 121. The third and fourth groups 115-3 and 115-4 of these lines are fed to OR gates 110-3 and 110-4, respectively, and the output signals D5 and D6 from these OR gates are fed to a supplemental logic expander 125. The fifth and sixth groups 115-5 and 115-6 of these lines are fed to OR gates 110-5 and 110-6, respectively, and the output signals D3 and D4 from these OR gates are fed to a second logic expander module 123. The AND gate array and OR gate array shown in FIG. 7 represent logic levels 1 and 2, and the array of logic expander modules shown therein represents a third level, whose output signals are fed to one or more macrocells for further processing or output.

The logic expander module 121 receives four configuration bits CB0, CB1, CB2 and CB3 that determine which one of the sixteen combinations of the two variables D1 and D2 is issued on an output line 126 and delivered to a macrocell 127. The logic expander module 123 receives four configuration bits CB4, CB5, CB6 and CB7 that determine which one of the sixteen possible combinations of the input variables D3 and D4 is issued on an output line 128 for the module 123 and delivered to a macrocell 129.

Optionally, a supplemental logic expander 125 is provided, as shown in FIG. 7, to receive any or all of the following input signals: (1) one or two data input signals D5 and D6 selected from the sum terms available from the OR gates 110-3 and 110-4; (2) feedback signals FB1 and FB3 received from the output signals of one, two or more of the logic expander modules 121 and 123; and (3) feedback signals FB2 and FB4 received from the output signals of the one, two or more macrocells 127 and 129 that receive the output signals of the logic expander modules 121 and 123, respectively. The supplemental logic expander module 125 is a hard-wired (i.e., non-programmable) module or a programmable module that produces a small subset, usually one to four, of the sixteen possible combinations of two logical variables D5 and D6 as output signals and provides these as input signals Fl and F2 directly to the logic expander modules 121 and 123, respectively, as shown in FIG. 7. If the supplemental logic expander module 125 is hard-wired, this module produces its output signals with less time delay than the time delay introduced by use of the programmable logic expander module(s).

For convenient reference, each of the logic expander modules 121 and 123 and supplemental logic expander module 125 in FIG. 7 is illustrated with two data input lines, although each of these modules could instead receive more than two such data input signals. In FIGS. 5, 6 and 7, an array of vertical lines is tied to an array of horizontal lines by an assembly of programmable connections or switches PC that may be fuses (active until burned), anti-fuses (inactive until burned), EPROMs, EEPROMs, or connections controlled by a ROM, a RAM, a shift register or another register, in order to selectively connect input lines to intermediate lines that provide input signals for one or more logic expander modules.

FIG. 8 illustrates another use of the logic expander module in a signal processing environment. A fixed or non-programmable signal processing module 131 receives two or more input signals and produces one or more output signals on an output line 130. This output signal is received by a first input terminal of a multiplexer 133 having two or more data input terminals. The MUX 133 receives another data input signal on an input line 132 at a second input terminal and receives a control signal Cl that determines which of the two data input signals issues on an output line 134 from the MUX 33. The output signal on output line 134 and at least one other data signal on an input line 136 are received by a logic expander module 135. The logic expander module 135 also receives two or more control signals C2 and C3 at two control input terminals and issues a processed output signal on an output line 138 that is received by an input terminal of a macrocell 137 for further processing or feedback or issuance as an output signal at an output pin of the system.

Some logic functions encountered in arithmetic operations require three variables rather than two for their representation. An example is the multiplication of two n-bit numbers $A=(A1, A2, \ldots, An)$ and $B=(B1, B2, \ldots, Bn)$, where the numbers A and B are represented by their corresponding bit assignments as shown. Defining $Zij = Ai.Bj$ $(i, j=1, 2, \ldots, n)$ as the product term of two of the bits, it can be shown that, at any level in the multiplication, the carry-out signal Cout and the sum-out signal Sout involve terms such as $Cin.Sin + Cin.Zij + Sin.Zij$ and $Cin + Sin + Zij$, respectively, where Cin and Sin are the carry-in and sum-in signals constructed from bit-by-bit multiplication at a lower level in a well known manner. Thus, three-variable logic functions such as $A.B + B.C + A.C$ and $A + B + C$ may be required for some arithmetic operations. Table 4 sets forth representative examples of the 256 possible combinations of three logical variables that may occur, using the de Morgan identities $(A+B)^* = A^*.B^*$ and $(A.B)^* = A^* + B^*$ and the Boolean identities $A.A = A$ and $A.A^* = 0$, for any two logical variables A and B. The other combinations may be found by permutation of the three variables A, B and C.

TABLE 4

Representative Combinations of Three Logical Variables.

0, 1, A, A*, B, B*, C, C*,
A + B, (A + B)* = A* · B*, A · B, (A · B)* = A* + B*,
A + B*, (A + B*) = A* · B,
A + B = A · B* + A* · B, (A + B)* = A · B + A* · B*,
A + B + C, (A + B + C)* = A* · B* · C*, A* + B + C,
(A* + B + C)* = A · B* · C*, A* + B* + C,
(A* + B* + C)* = A · B · C*, A* + B* + C*,
(A* + B* + C*)* = A · B · C,
(A + B) · C, ((A + B) · C)* = A* · B* + C*,
(A* + B) · C, ((A* + B) · C)* = A · B* + C*,
(A + B) · C*, ((A + B) · C*)* = A* · B* + C,
(A* + B*) · C, ((A* + B*) · C)* = A · B + C*,
(A* + B) · C*, ((A* + B) · C*)* = A · B* + C,
(A* + B*) · C*, ((A* + B*) · C*)* = A · B + C,
(A + B) + C, ((A + B) + C)* = (A* + B) · C*,
(A* + B) + C, ((A* + B) + C)* = (A + B) · C*,

TABLE 4-continued

Representative Combinations of
Three Logical Variables.

$(A^* + B) + C^*, ((A^* + B) + C^*)^* = (A + B) \cdot C,$
$A + B + C,$
$(A + B + C)^* = A^* + B + C = A + B^* + C = A + B + C^*,$
$A \cdot B + B \cdot C + A \cdot C, A^* \cdot B + B \cdot C + A^* \cdot C,$
$A^* \cdot B^* + B^* \cdot C + A^* \cdot C,$
$A^* \cdot B^* + B^* \cdot C^* + A^* \cdot C^*$
$A \cdot B \cdot C, A^* \cdot B \cdot C, A^* \cdot B^* \cdot C$ The 256 combinations of the three logical variables A, B and C may be generated by the arrangement shown in FIG. 9 of the three input signals, eight control input signals CB0–CB7, three signal inverters 141, 143 and 145, and 24 pass transistors 151, 153, 155, 157, 159, 161, 163, 165, 167, 169, 171, 173, 175, 177, 179, 181, 183, 185, 187, 191, 193, 195 and 197. The analysis of FIG. 9 is analogous to the analysis of FIG. 4 for the two-variable situation. For example, the second vertical line of pass transistors 157, 159 and 161 produces the signal CB6.A*.B.C, which is either A*.B.C or 0 according as the control signal CB6=1 or CB6=0; or this signal floats if A=1 or B=0 or C=0. The signals produced by each of the eight vertical lines of three pass transistors each are passed to a signal summation means 147, which may be a simple wire or an OR gate, to produce an output signal that is logically representable as $$OUT = CB7 \cdot A \cdot B \cdot C + CB6 \cdot A^* \cdot B \cdot C +$$
$$CB5 \cdot A \cdot B^* \cdot C + CB4 \cdot A \cdot B \cdot C^* +$$
$$CB3 \cdot A^* \cdot B^* \cdot C + CB2 \cdot A^* \cdot B \cdot C^* +$$
$$CB1 \cdot A \cdot B^* \cdot C^* + CB0 \cdot A^* \cdot B^* \cdot C^*.$$

The logical signal OUT produced on the summation means 147 in FIG. 9 can generate the $2^8=256$ different logical functions of the three variables A, B and C shown in Table 4. The configuration shown in FIG. 9 may be replaced by any of the 255 permutations thereof by changing the locations of two or more of the 24 pass transistors shown in FIG. 9.

In the configuration of FIG. 9 for three logical variables A, B and C, each of the eight vertical lines is connected to one configuration bit and contains three pass transistors in series. Each of the six horizontal lines is connected to a source of one of the variables A, A*, B, B*, C and C* and is connected to the pass terminal of four pass transistors. Each of the eight vertical lines contains one pass transistor assigned to one of the pair of variables A and A*, one pass transistor assigned to one of the pair of variables B and B*, and one pass transistor assigned to one of the pair of variables C and C*. The eight vertical lines cover the eight possible permutations for such assignments. If a proper subset of the 256 possible combinations is to be generated and issued, use of fewer than eight configuration bits is possible.

A look-up table LUT, which has $2^3=8$ pages with 256 entries per page and a total of 2048 entries, may also be used as shown in FIG. 10 to generate the 256 combination signals, by analogy with the two-variable look-up table illustrated in FIG. 3. The three logical variables A, B and C specify the page of the memory to be used, and the eight control signals CB0–CB7 determine which of the 256 entries on that page shall be issued as an output signal from the look-up table LUT.

The 256 combinations of the three logical variables A, B and C may also be generated by forming suitable combinations logic gates such as inverters and AND, NAND, OR, NOR, XOR and XNOR gates, by analogy with FIGS. 1 and 2.

Where switches or similar connections are used, it is often desirable to minimize the number of programmable switches present so as to avoid capacitance loading of the circuit. Capacitance loading increases with the number of switches present on a given line, no matter which way the switches are programmed. Thus, it is often desirable to provide other fixed, non-programmable connections or no connections, if device speed or reduction of time delay for signal propagation is an important factor in device performance.

As noted above, the logic expander module is intended to operate as a third level of logic that is integrated with the first and second levels of logic, represented by an array of AND gates and an array of OR gates, where one array feeds signals to the other array through programmable or non-programmable connections between the AND gates and the OR gates. In FIG. 7, the assembly of vertical lines 111-1, ..., 111-6 represents the input lines to the AND gate array. Each such line is called "product line". The assembly of horizontal lines 114A, ..., 114D represents output lines from the AND gate array that feed a collection of OR gates, whose vertical output lines, called "sum lines," may be selectively directed to the input terminals of one or more logic expander modules, supplemental logic expander modules or macrocells. Each connection between an AND gate output line and an OR gate input line may be programmable or non-programmable. If this connection is programmable, the connection maY be mask programmable, fuse programmable or switch programmable as desired. If a fuse or other programmable switch is used for the connection, the connection between the two lines will be operative unless the fuse is affirmatively open or burned out. If a switch such as an EPROM or an EEPROM is used for the connection, the switch will normally be open or non-operative unless it is affirmatively closed. Some of the AND gate input signals and OR gate input signals may be fed directly to the logic expander modules, supplemental logic expander modules or macrocells if desired.

FIG. 11 illustrates one mode of operation of a plurality of programmable logic expanders in tandem, with each logic expander, except possibly the end ones, receiving input data from two or more adjacent logic expanders as well as input data from upstream sources in the data flow.

A first plurality of signal lines 196-1, 196-2 and 196-3 delivers signals for processing, and these signals are selectively connected to three pluralities of input lines for logic expander modules by programmable connections such as PC. The first plurality of input lines 198-1, 198-2 and 198-3 provides data input signals for a logic expander module 202. A second plurality of input lines 199-1, 199-2 and 199-3 provides data input signals for a second logic expander module 203. A third plurality of input lines 200-1, 200-2 and 200-3 provides input lines for a third logic expander module 204.

A representative logic expander module 203 receives input data on a plurality of input lines 199-1, 199-2 and 199-3 and receives further input data on sidefeed input lines 211 and 213 from two or more adjacent logic expanders 202 and 204. The logic expander module 203 processes the input signals and issues an output signal on output line 219; this output signal is also provided to the logic expander 203 on a feedback input line 217. The logic expander module 203 also receives input data on a side-feed input line 215 from at least one of the other logic expander modules such as 204. In addition to the output signal issued on output line 219 by the module 203, side-feed output signals are generated and issued on output lines 221, 223 and 225, to be received by other logic expander modules in the arrangement. The upstream data input lines 199-1, 199-2 and 199-3 for the module 203 may receive these input signals from a programmable logic array or from some other source.

The embodiments of the invention illustrated in FIGS. 4 and 9 are particular examples of a more general embodiment that provides arbitrary combinations of m logical variables D1, D2, ..., Dm. This requires up to $2^m$ control signals Cj (j=1,2,...,$2^m$) and may be implemented using up to m.$2^m$ pass transistors by analogy with FIG. 4 (for m=2) and FIG. 9 (for m=3). The goal is to generate an output signal OUT that is equivalent to a sum $$\text{OUT} = \sum_{j=1}^{2^m} C_j \cdot L_j,$$

where each Lj is a logical product of logical variable terms Pr (r=1,2,...,m). If this embodiment is to generate all $2^{2m}$ possible combinations using the m variables D1, D2, ..., Dm and their logical complements, each logical variable Pr in the logical product Lj should be either Dr or Dr*. If this embodiment is to generate a proper subset (less than all) of the possible $2^{2m}$ combinations, then the number of control signals Cj may be less than $2^m$ and one or more of the logical variables Pr in a logical product term Lj may be chosen to be Dr or Dr* or logical 1. If the logical variable Pr is chosen to be logical 1 for a particular term in the sum that is equivalent to OUT above, neither the variable Dr nor the variable Dr* will appear in that term Lj. In this manner subsets of less than all available terms can be generated. The sum OUT may be generated by the abovementioned combinations of m input data terms, $2^m$ control signals and m.$2^m$ pass transistors, arranged by analogy with FIGS. 4 and 9. However, other embodiments such as look-up tables with up to $2^{(m+2m)}$ table entries or the multiplexer-controlled device shown in FIGS. 1 and 2 for m=2 may also be used; and these other embodiments also produce an output signal that is equivalent to the sum OUT set forth above.

I claim:

1. A programmable logic device comprising:
   a plurality of groups of logic gates in a first array of logic gates, with each logic gate having at least two input terminals and having an output terminal;
   a plurality of logic gates in a second array, with each logic gate having at least one input terminal and having an output terminal;
   within each group of logic gates of the first array, a connection between the output terminals of this group and input terminals of selected logic gates in the second array;
   a plurality of logic device input terminals;
   first programming means for selectively connecting each logic device input terminal to an input terminal of selected logic gates in the first array, for producing a first group of desired output signals at the output terminals of the selected logic gates of the second array;
   logic expander means having at least first and second data input terminals to receive two input signals D1 and D2 from the output terminals of the second array of logic gates, respectively, having an integer number n of control input terminals to receive n control signals thereat, where n is an integer that is greater than zero and less than five, and having an output terminal thereat, for producing a desired output signal that is selectively determined by the n control signals to be one of the logical signals 0, 1, D1, D2, D1*, D2*, D1+D2, (D1+D2)*, D1.D2, (D1.D2)*, D1*+D2, D1+D2*, D1*.D2, D1.D2*, D1⊕D2 and (D1⊕D2)*; and
   second programming means for providing n control signals at the n control input terminals.

2. The device of claim 1, wherein said first and second arrays are drawn from a class of logic devices consisting of AND gate arrays and OR gate arrays.

3. The device of claim 1, wherein said first array of logic gates is an AND gate array and said second array of logic gates is an OR gate array.

4. The device of claim 1, wherein said first array of logic gates is an OR gate array and said second array of logic gates is an AND gate array.

5. The device of claim 1, further comprising third programming means for selectively connecting said output terminal of each logic gate within a chosen one of said groups of logic gates in said first array to said input terminals of said selected logic gates in said second array.

6. The device of claim 5, wherein said third programming means is drawn from a class of programmable connection controls consisting of fuses, anti-fuses, EPROMs, EEPROMs, ROMs, RAMs, shift registers, and other registers.

7. The device of claim 1, wherein said first programming means is drawn from a class of programmable connection controls consisting of fuses, anti-fuses, EPROMs, EEPROMs, ROMs, RAMs, shift registers and other registers.

8. The device of claim 1, wherein said second programming means is drawn from a class of programmable connection controls consisting of fuses, anti-fuses, EPROMs, EEPROMs, ROMs, RAMs, shift registers and other registers.

9. The device of claim 1, wherein said integer n is equal to four and wherein said logic expander means comprises:
   a first NOR gate having an output terminal and having first and second input terminals connected to said first and second input terminals, respectively, of said logic expander means;
   a first inverter having an output terminal and having an input terminal connected to said first input terminal of said logic expander means;
   a second inverter having an output terminal and having an input terminal connected to said second input terminal of said logic expander means;
   a second NOR gate having an output terminal and having first and second input terminals that are connected to said second input terminal of said logic expander means and to the output terminal of the first inverter;
   a third NOR gate having an output terminal and having a first input terminal that is connected to said first input terminal of said logic expander means and having a second input terminal that is connected to the output terminal of the second inverter;

a NAND gate having an output terminal and having first and second input terminals that are connected to said first and second input terminals, respectively, of said logic expander means;

an XOR gate having an output terminal and having first and second input terminals that are connected to said first and second input terminals, respectively, of said logic expander means;

a source of ground voltage;

a multiplexer having three control input terminals to receive control input signals thereat, having eight input terminals to receive the output signals from the first, second and third NOR gates, the first and second inverters, the NAND gate, the XOR gate and the ground voltage source, and having an output terminal to issue one of the input signals as an output signal according to the control input signals received; and polarity control means having an input terminal connected to the output terminal of the multiplexer to receive an input signal from the multiplexer, having a control input terminal and having an output terminal, for receiving a polarity control signal at the control input terminal and for issuing the input signal or the logical complement of the input signal as an output signal at the output terminal according to the polarity control signal received, where the multiplexer has said first, second and third control input terminals to receive first, second and third control signals thereat that determine which of the eight signals received at the eight input terminals of the multiplexer shall be issued as a signal at the output terminal of the multiplexer, and where the control input terminal of the polarity control means gate serves as said fourth control input terminal to receive a fourth control signal that determines the polarity of the output signal issued at the output terminal of the polarity control means.

10. The device of claim 9, wherein said polarity control means is a second XOR gate having an output terminal and two input terminals, where one of these input terminals serves as said control input terminal for said polarity control means and said polarity control signal received at this input terminal is either a logical zero signal or a logical one signal.

11. The device of to claim 1, wherein said logic expander means comprises a look-up table having two data input terminals, having n control input terminals, having up to $2^{n+2}$ table entries, and producing said desired output signal according to the signals received at said first and second data input terminals and at said n control input terminals.

12. The device of claim 1, wherein said logic expander means comprises:

a first signal line that receives and propagates said input signal D1;

a second signal line that receives said input signal D1, inverts this signal and propagates said signal D1*;

a third signal line that receives and propagates said input signal D2;

a fourth signal line that receives said input signal D2, inverts this signal and propagates said signal D2*;

a plurality of 2n pass transistors numbered 1, 2, ..., 2n, with each pass transistor having an input terminal, a pass terminal and an output terminal, with pass transistor number j having its input terminal connected to said control input terminal number j (j=1, 2, ..., n) and with pass transistor number j+n having its input terminal connected to the output terminal of pass transistor number j, where the pass terminal of each pass transistor is connected to at most two of the first, second, third or fourth signal lines, no signal line is connected to more than two pass terminals and the set of pass transistors connected to one signal line is different from the set of pass transistors connected to any other of the four signal lines; and signal summation means having n input terminals and an output terminal and being connected to the output terminal of each of the pass transistors number n+k (k=1,2, ...,n), for producing at the output terminal the sum of the signals received at the input terminals.

13. The device of claim 12, wherein said integer n is four and wherein each of said four signal lines is connected to said pass terminals of two of said pass transistors.

14. The device of claim 13, wherein said first signal line is connected to said pass terminal of said first and said fifth pass transistors, said second signal line is connected to said pass terminals of said third and said seventh pass transistors, said third signal line is connected to said pass terminals of said second and said fourth pass transistors, and said fourth signal line is connected to said pass terminals of said sixth and said eighth pass transistors.

15. The device of claim 13, wherein said output signal from said signal summation means is equivalent to the logical sum of four product terms of logical variables, CS1.D1.D2+CS2.D1*.D2+CS3.D1.D2*+CS4.D1*.D2*, where CS1, CS2, CS3 and CS4 are said four control signals received at said control input terminals.

16. The device of claim 1 further comprising a plurality of additional logic expander means, each having at least two data input terminals to receive input signals from the output terminals of the second array of logic gates, each having an integer number of control input terminals to receive a corresponding number of control signals, wherein said integer number is greater than zero and less than five, and each having an output terminal, for producing a desired output signal on said output terminal that is selectively determined by the control signals to be one of the logical signals 0, 1, Dk, D1, Dk*, D1*, Dk+D1, (Dk+D1)*, Dk.D1, (Dk.D1)*, Dk*=D1, Dk+D1*, Dk*.D1, Dk.D1*, Dk+D1 and (Dk+D1)*, where Dk and D1 are said input signals received by said additional logic expander means, and wherein said programming means further provides the integer number of control signals at the control input terminals of each of said plurality of additional logic expander means.

17. The new device of claim 16 further comprising a plurality of macrocells, each macrocell having at least one input connected to the output of one of said logic expander means, each macrocell also having an output terminal, said macrocells providing further processing of signals at said output of said logic expander means and said additional logic expander means.

18. The device of claim 17 wherein the output terminal of at least one macrocell is connected to an input of at least one logic expander means.

19. A programmable logic circuit to accept three input signals from a logic gate array of logic devices on a programmable logic device and to produce a selected logic function as output signal that depends on the input signals, the circuit comprising:

logic expander means having first, second and third data input terminals for receiving three input signals D1, D2 and D3, respectively, having an output terminal, and having up to eight control input terminals to receive control signals thereat, for producing a desired output signal that is selectively determined by the control signals and is equivalent to the logical sum of logic variables $CS1.D1.D2.D3+CS2.D1^*.D2.D3+CS3.D1.D2^*D3+CS4.D1 D2.D3^*+CS5.D1^*.D2^*.D3+CS6.D1^*.D2.D3^*+CS7.D1.D2^* D3^*+CS8\ D1^*.D2^*.D3^*$, where CS1, CS2, CS3, CS4, CS5, CS6, CS7 and CS8 are control signals delivered to the control input terminals; and programming means for providing the control signals at the control input terminals to produce a desired output signal for the logic expander means.

20. The circuit of claim 19, wherein said programming means comprises a plurality of independently programmable control signal sources and each control signal source is drawn from a class consisting of fuses, anti-fuses, EPROMs, EEPROMs, ROMs, RAMs, shift registers and other registers.

21. The circuit of claim 19, wherein said logic expander means comprises a look-up table having said three data input terminals, having said control input terminals, having said output terminal, having up to 2048 table entries and producing said selected output signal at said output terminal according to the signals received at said first, second and third data input terminals and at said control input terminals.

22. The circuit of claim 19, wherein said logic expander means comprises:

a first signal line that receives and propagates said input signal D1;

a second signal line that receives said input signal D1, inverts this signal and propagates the signal D1*;

a third signal line that receives and propagates said input signal D2;

a fourth signal line that receives said input signal D2, inverts this signal and propagates the signal D2*;

a fifth signal line that receives and propagates said input signal D3;

a sixth signal line that receives said input signal D3, inverts this signal and propagates the signal D3*;

a plurality of 3n pass transistors with $n<8$, numbered 1, 2, ..., 3n, with each pass transistor having an input terminal, a pass terminal and an output terminal, with pass transistor number j having its input terminal connected to said control input terminal number j (j=1, 2, .., n), with pass transistor number j+n having its input terminal connected to the output terminal of pass transistor number j, and with pass transistor number j+2n having its input terminal connected to the output terminal of pass transistor number j+n, where the pass terminal of each pass transistor is connected to one of the first, second, third, fourth, fifth or sixth signal lines, no signal line is connected to more than four pass terminals and the set of pass transistors connected to one signal line is different from the set of pass transistors connected to any other of the six signal lines; and an output line connected to the output terminal of each of the pass transistors number k+2n (k=1, 2, ..., n), for producing at the output terminal the sum of the signals received thereat.

23. The device according to claim 22, wherein n=8 and each of said six signal lines is connected to said pass terminals of four of said pass transistors.

* * * * *

UNITED STATES PATENT AND TRADEMARK OFFICE
CERTIFICATE OF CORRECTION

PATENT NO. : 4,967,107

DATED : October 30, 1990

INVENTOR(S) : Cecil H. Kaplinsky

It is certified that error appears in the above-identified patent and that said Letters Patent is hereby corrected as shown below:

On the title page item [54] Abstract, line 5, "functiosn" should read --functions--.

Column 8, line 24, "N $\geq$ 2" should read -- N $\geq$ 2 --.

Column 9, line 3, "1114" should read -- 111-4 --.

Column 10, line 20, "33" should read -- 133 --.

Column 12, line 34, "maY" should read -- may --.

Claim 9, column 15, line 38, "control means gate serves" should read -- control means serves --.

Claim 15, column 16, line 35, "CS1.D1.D2+CS2.D1*.D2+CS3.D1.D2*+CS4.D1*.-D2*," should read -- CS1·D1·D2+CS2·D1*·D2+CS3·D1·D2*+CS4·D1*·D2*, --.

Claim 16, column 16, line 50, "Dk* = D1" should read -- Dk* + D1 --.

Claim 17, column 16, line 57, "The new device" should read -- The device --.

Claim 17, column 16, line 62, "output" should read -- outputs --.

UNITED STATES PATENT AND TRADEMARK OFFICE
CERTIFICATE OF CORRECTION

PATENT NO. : 4,967,107

DATED : October 30, 1990

INVENTOR(S) : Cecil H. Kaplinsky

Page 2 of 2

It is certified that error appears in the above-identified patent and that said Letters Patent is hereby corrected as shown below:

Claim 19, column 17, lines 12-15,
"CS1.D1.D2.D3+CS2.D1*.D2.D3+CS3.D1.D2*
D3                              +CS4.D1
D2.D3*+CS5.D1*.D2*.D3+CS6.D1*.D2.D3* -
+CS7.D1.D2*   D3*+CS8   D1*.D2*.D3*, where" should read:
-- CS1·D1·D2·D3+CS2·D1*·D2·D3+CS3·D1·D2*·D3
+CS4·D1·D2·D3*+CS5·D1*·D2*·D3+CS6·D1*·D2·D3*
+CS7·D1·D2*·D3*+CS8·D1*·D2*·D3*, where - -.

In the logical variables occuring in column 3, lines 15 and 16; column 4, lines 2, 8, 31, 45 and 52; column 6, lines 61 and 67; column 7, line 18, 19, 25 and 26; column 8, lines 36, 44 and 45; column 10, lines 35, 38, 39, 43 and 47-49; column 11, line 22; claim 1, column 14, lines 13-14; claim 15, column 16, line 35; claim 16, column 16, lines 49-50; claim 19, column 17, lines 12-15 the periods "." appearing between variable terms should be logical multiplier symbols  - - · - - , e.g. D1.D2 should read D1·D2).

Signed and Sealed this

Third Day of March, 1992

Attest:

HARRY F. MANBECK, JR.

*Attesting Officer*        *Commissioner of Patents and Trademarks*